United States Patent
Sugiyama

(10) Patent No.: US 8,695,186 B2
(45) Date of Patent: Apr. 15, 2014

(54) METHOD FOR MANUFACTURING PIEZOELECTRIC VIBRATOR

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 695 days.

(21) Appl. No.: 12/850,989

(22) Filed: Aug. 5, 2010

(65) Prior Publication Data

US 2011/0035916 A1  Feb. 17, 2011

(30) Foreign Application Priority Data

Aug. 12, 2009  (JP) ................ 2009-187476

(51) Int. Cl.
*H03H 9/10* (2006.01)
*H03H 9/21* (2006.01)

(52) U.S. Cl.
USPC ......... 29/25.35; 29/830; 438/455; 65/36; 156/272.2; 156/274.4; 156/380.2; 310/344; 310/348

(58) Field of Classification Search
USPC ........ 29/25.35, 830; 156/272.2, 274.4, 380.2; 65/36; 438/455, 456, 466; 310/344, 310/348; 445/24; 257/698, 778
See application file for complete search history.

(56) References Cited

U.S. PATENT DOCUMENTS

| 4,652,787 A | * | 3/1987 | Zingg ................ 310/344 |
| 6,491,561 B2 | * | 12/2002 | Kim ................... 445/24 |
| 2007/0029654 A1 | * | 2/2007 | Sunohara et al. ...... 257/778 X |

FOREIGN PATENT DOCUMENTS

| JP | 06-283951 A | | 10/1994 |
| JP | 2007019310 A | * | 1/2007 |

* cited by examiner

*Primary Examiner* — A. Dexter Tugbang
(74) *Attorney, Agent, or Firm* — Brinks Gilson & Lione

(57) ABSTRACT

Providing a method for manufacturing a package capable of suppressing occurrence of a discharge phenomenon during the anodic bonding and achieving stable anodic bonding of the base board and the bonding film. Providing a method for manufacturing a package including: an alignment step where an inner surface of the lid board 50 is superimposed onto an inner surface of the base board 40, and an outer surface of the base board 40 is disposed on an electrode base portion 70 for anodic bonding; and an anodic bonding step where a bonding voltage is applied between the bonding film 35 and the electrode base portion 70 while heating them to a bonding temperature, whereby the bonding film 35 and the base board 40 are anodically bonded, wherein the anodic bonding step involves applying the bonding voltage in a state where the penetration electrodes 32, 33 are exposed to a void portion 73 formed in the electrode base portion 70.

7 Claims, 19 Drawing Sheets

METHOD FOR MANUFACTURING PIEZOELECTRIC VIBRATOR

RELATED APPLICATIONS

This application claims priority under 35 U.S.C. §119 to Japanese Patent Application No. 2009-187476 filed on Aug. 12, 2009, the entire content of which is hereby incorporated by reference.

BACKGROUND OF THE INVENTION

1. Field of the Invention

The present invention relates to a method for manufacturing a package, a method for manufacturing a piezoelectric vibrator, a piezoelectric vibrator manufactured by the manufacturing method, and an oscillator, an electronic device, and a radio-controlled timepiece each having the piezoelectric vibrator.

2. Description of the Related Art

Recently, a piezoelectric vibrator utilizing quartz or the like is used in a cellular phone and a portable information terminal as the time source, the timing source of a control signal, a reference signal source, and the like.

As the piezoelectric vibrator of this type, an SMD (Surface Mount Device)-type piezoelectric vibrator as disclosed in JP-A-6-283951, for example, is known. As shown in FIGS. 21 and 22, a piezoelectric vibrator 200 includes a base board 201 and a lid board 202 which are bonded to each other, and a piezoelectric vibrating reed 203 which is sealed in a cavity C formed between both boards 201 and 202.

The piezoelectric vibrating reed 203 is, for example, a tuning-fork type vibrating reed and is disposed in the cavity C and mounted on the upper surface of the base board 201.

The base board 201 and the lid board 202 are formed of a glass board, for example, and through-holes 204 are formed in the base board 201 among both boards 201 and 202 so as to penetrate through the base board 201. In the through-holes 204, conductive members are buried so as to close the through-holes 204, thus forming penetration electrodes 205. The penetration electrodes 205 are electrically connected to outer electrodes 206 which are formed on the outer surface (lower surface) of the base board 201 and are also electrically connected to the piezoelectric vibrating reed 203 which is mounted in the cavity C. In addition, a bonding film 207 is formed over an entire surface of the lid board 202 facing the base board 201, and the bonding film 207 is anodically bonded to the base board 201.

Meanwhile, as shown in FIG. 23, in the course of manufacturing the piezoelectric vibrator 200, when the bonding film 207 and the base board 201 are anodically bonded, after setting the base board 201 and the lid board 202, which are superimposed onto each other, on an electrode base portion 208 for anodic bonding, a bonding voltage is applied between the bonding film 207 and the electrode base portion 208 while heating them to a bonding temperature. In this way, the bonding voltage is applied between the bonding film 207 and the electrode base portion 208 in a state where ions in the base board 201 heated to the bonding temperature have mobility, whereby current flows between the base board 201 and the bonding film 207. As a result, an electrochemical reaction can occur at an interface between the bonding film 207 and the base board 201, and both boards can be anodically bonded.

However, in the manufacturing method of the piezoelectric vibrator according to the related art, the anodic bonding is achieved in a state where the penetration electrodes 205 are in contact with the electrode base portion 208, and the piezoelectric vibrating reed 203 being electrically connected to the penetration electrodes 205 is adjacent to the bonding film 207. Therefore, there was a concern in that when the bonding voltage is applied between the bonding film 207 and the electrode base portion 208, a discharge phenomenon (spark discharge) may take place between the bonding film 207 and the piezoelectric vibrating reed 203.

Therefore, there was a problem in that when such a discharge phenomenon occurs, a sufficient amount of current does not flow between the base board 201 and the bonding film 207, and thus, the base board 201 and the bonding film 207 are not anodically bonded. In addition, if the discharge phenomenon takes place once, the bonding film 207 will be separated and scattered, and the scattered bonding film 207 will be stuck to the piezoelectric vibrating reed 203, for example, whereby a discharge path is formed between the bonding film 207 and the piezoelectric vibrating reed 203. Therefore, it is difficult to cause current necessary for the anodic bonding to flow between the base board 201 and the bonding film 207.

SUMMARY OF THE INVENTION

The present invention has been made in view of the foregoing, and an object of the present invention is to provide a method for manufacturing a package capable of suppressing occurrence of a discharge phenomenon during the anodic bonding and achieving stable anodic bonding of the base board and the bonding film and to provide a method for manufacturing a piezoelectric vibrator. Another object of the present invention is to provide a piezoelectric vibrator manufactured by the manufacturing method and an oscillator, an electronic device, and a radio-controlled timepiece each having the piezoelectric vibrator.

The present invention provides the following means in order to solve the problems.

According to an aspect of the present invention, there is provided a method for manufacturing a package including: a base board and a lid board which are made of a glass material and superimposed onto each other so as to form a cavity therebetween; an inner electrode which is formed on the base board so as to be accommodated in the cavity; a penetration electrode which is formed to penetrate through the base board so as to be electrically connected to the inner electrode; and a bonding film which is formed over an entire surface of the lid board facing the base board and anodically bonded to the base board at a portion thereof being in contact with the base board, the method including: an alignment step where an inner surface of the lid board is superimposed onto an inner surface of the base board, and an outer surface of the base board is disposed on an electrode base portion for anodic bonding; and an anodic bonding step where a bonding voltage is applied between the bonding film and the electrode base portion while heating them to a bonding temperature, whereby the bonding film and the base board are anodically bonded, wherein the anodic bonding step involves applying the bonding voltage in a state where the penetration electrode is exposed to a void portion formed in the electrode base portion.

According to this aspect, since the penetration electrode is exposed to the void portion during the anodic bonding step, no current will flow directly from the electrode base portion to the penetration electrode. That is, when the bonding voltage is applied between the bonding film and the electrode base portion during the anodic bonding step, it is possible to suppress current from flowing to the penetration electrode and suppress occurrence of a large potential difference between the bonding film and a wiring (for example, a piezoelectric vibrating reed and the like) in the cavity electrically connected to the inner electrode. Therefore, it is possible to suppress occurrence of a discharge phenomenon (spark discharge) between the bonding film and the wiring in the cavity. In this way, it is possible to secure a sufficient amount of current flowing to the bonding film and the base board and achieve stable anodic bonding of the base board and the bonding film.

In addition, the electrode base portion may include an electrode base body and a dummy member which is made of a material whose inner ions are capable of moving at the bonding temperature and is arranged on the electrode base body, and in which a void portion is formed, and the anodic bonding step may involve applying the bonding voltage between the electrode base body and the bonding film while heating them to the bonding temperature.

In this case, the dummy member is made of a material whose inner ions are capable of moving at the bonding temperature, and during the anodic bonding step, the bonding voltage is applied between the electrode base body and the bonding film while heating them to the bonding temperature. Therefore, the ions (charged particles) are allowed to move and current flows in the dummy member, whereby an electrochemical reaction can occur at an interface between the bonding film and the base board. In this way, it is possible to achieve anodic bonding of the base board and the bonding film.

In addition, since the electrode base portion includes the dummy member arranged on the electrode base body, it is possible to separate the penetration electrode and the electrode base body from each other during the anodic bonding step by a distance corresponding to the dummy member. Thus, it is possible to suppress occurrence of a discharge phenomenon between the penetration electrode and the electrode base body.

In addition, a thermal expansion coefficient of the dummy member may be equal to a thermal expansion coefficient of the base board.

In this case, since the thermal expansion coefficient of the dummy member is equal to the thermal expansion coefficient of the base board, the base board and the dummy member will experience the same thermal expansion when they are heated in the anodic bonding step. Therefore, it is possible to suppress a relative positional shift between the penetration electrode and the void portion resulting from the thermal expansion. Thus, it is possible to stably secure a state where the penetration electrode is exposed to the void portion.

According to another aspect of the present invention, there is provided a method for manufacturing a piezoelectric vibrator including a piezoelectric vibrating reed mounting step where before the alignment step of the manufacturing method of the package according to the above aspect of the present invention, a piezoelectric vibrating reed is electrically connected to the inner electrode so that the piezoelectric vibrating reed is accommodated in the cavity.

According to this aspect, since the alignment step and anodic bonding step of the manufacturing method of the package according to the above aspect of the present invention are executed in the course of manufacturing the piezoelectric vibrator, it is possible to suppress occurrence of a discharge phenomenon during the anodic bonding and achieve stable anodic bonding of the base board and the bonding film.

According to a further aspect of the present invention, there is provided a piezoelectric vibrator that is manufactured by the manufacturing method of the piezoelectric vibrator according to the above aspect of the present invention.

According to this aspect, since the piezoelectric vibrator is manufactured by the manufacturing method described above, it is possible to achieve stable anodic bonding of the base board and the bonding film. Thus, it is possible to secure air-tightness of the inside of the cavity and achieve high quality of the piezoelectric vibrator.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

In the oscillator, electronic device, and radio-controlled timepiece according to the above aspect of the present invention, since they have the high-quality piezoelectric vibrator, it is possible to achieve high quality.

According to the manufacturing method of the package and the manufacturing method of the piezoelectric vibrator according to the above aspect of the present invention, it is possible to suppress occurrence of a discharge phenomenon during the anodic bonding and achieve stable anodic bonding of the base board and the bonding film.

According to the piezoelectric vibrator according to the above aspect of the present invention, since the piezoelectric vibrator is manufactured by the method described above, it is possible to obtain a high-quality piezoelectric vibrator.

According to the oscillator, electronic device, and radio-controlled timepiece according to the above aspect of the present invention, since they have the piezoelectric vibrator described above, it is possible to achieve high quality.

DETAILED DESCRIPTION OF THE PREFERRED EMBODIMENTS

Figure 1:
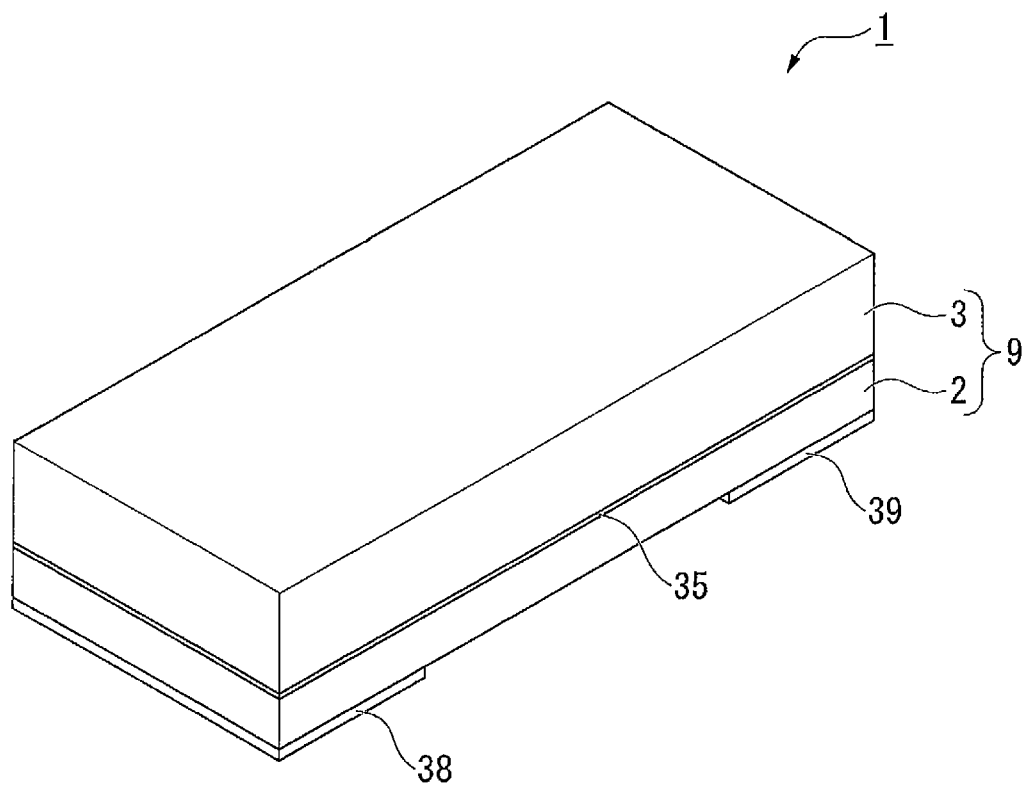
FIG. 1 is a perspective view showing an external appearance of a piezoelectric vibrator according to an embodiment of the present invention.

Hereinafter, a piezoelectric vibrator according to an embodiment of the present invention will be described with reference to the drawings.

As shown in FIGS. 1 to 4, a piezoelectric vibrator 1 according to the present embodiment is an SMD-type piezoelectric vibrator including: a package 9 having a base board 2 and a lid board 3 which are superimposed onto each other so as to form a cavity C therebetween; and a piezoelectric vibrating reed 4 which is accommodated in the cavity C and electrically connected to lead-out electrodes (inner electrodes) 36 and 37 described later.

Figure 3:
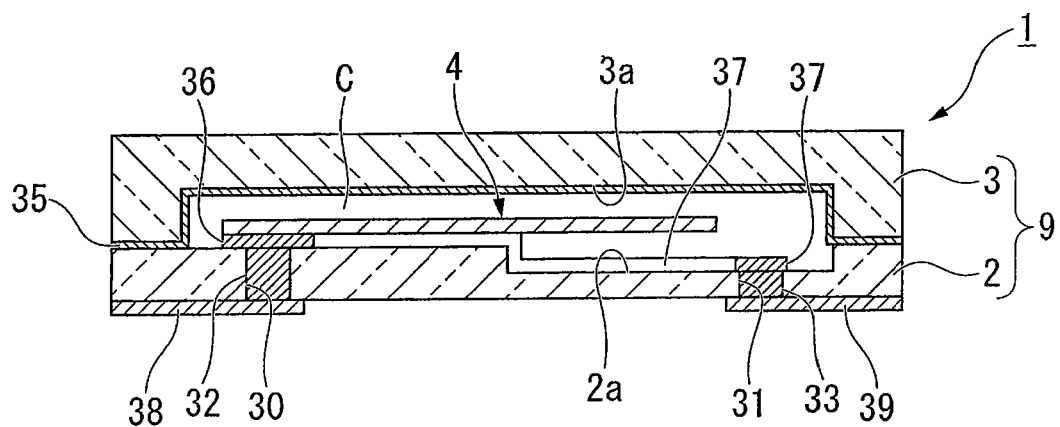
FIG. 3 is a sectional view of the piezoelectric vibrator taken along the line A-A in FIG. 2.
Figure 4:
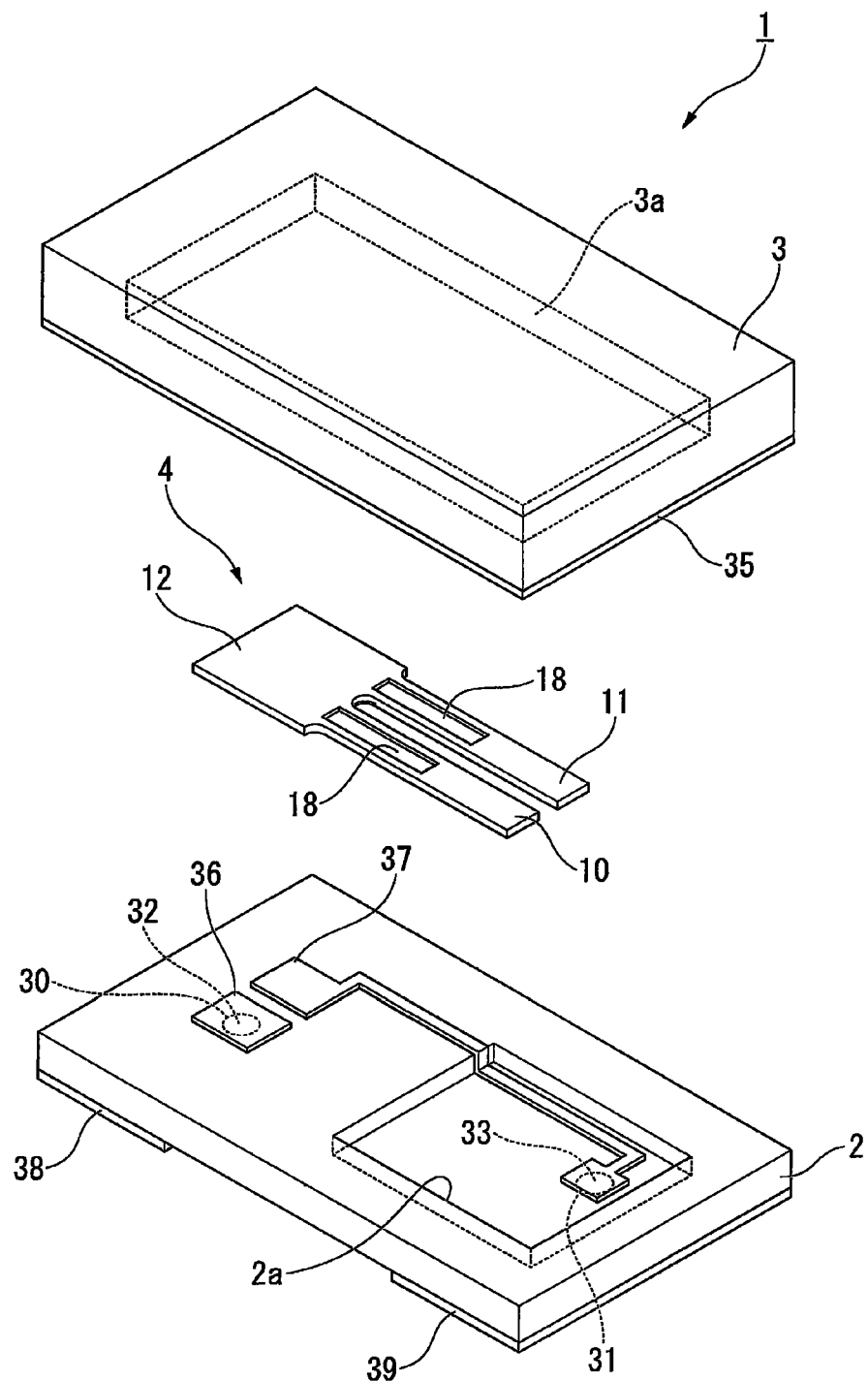
FIG. 4 is an exploded perspective view of the piezoelectric vibrator shown in FIG. 1.

In FIGS. 3 and 4, for better understanding of the drawings, illustrations of the excitation electrode 15, extraction electrodes 19 and 20, mount electrodes 16 and 17, and weight metal film 21 of the piezoelectric vibrating reed 4 are omitted.

Piezoelectric Vibrating Reed

Figure 5:
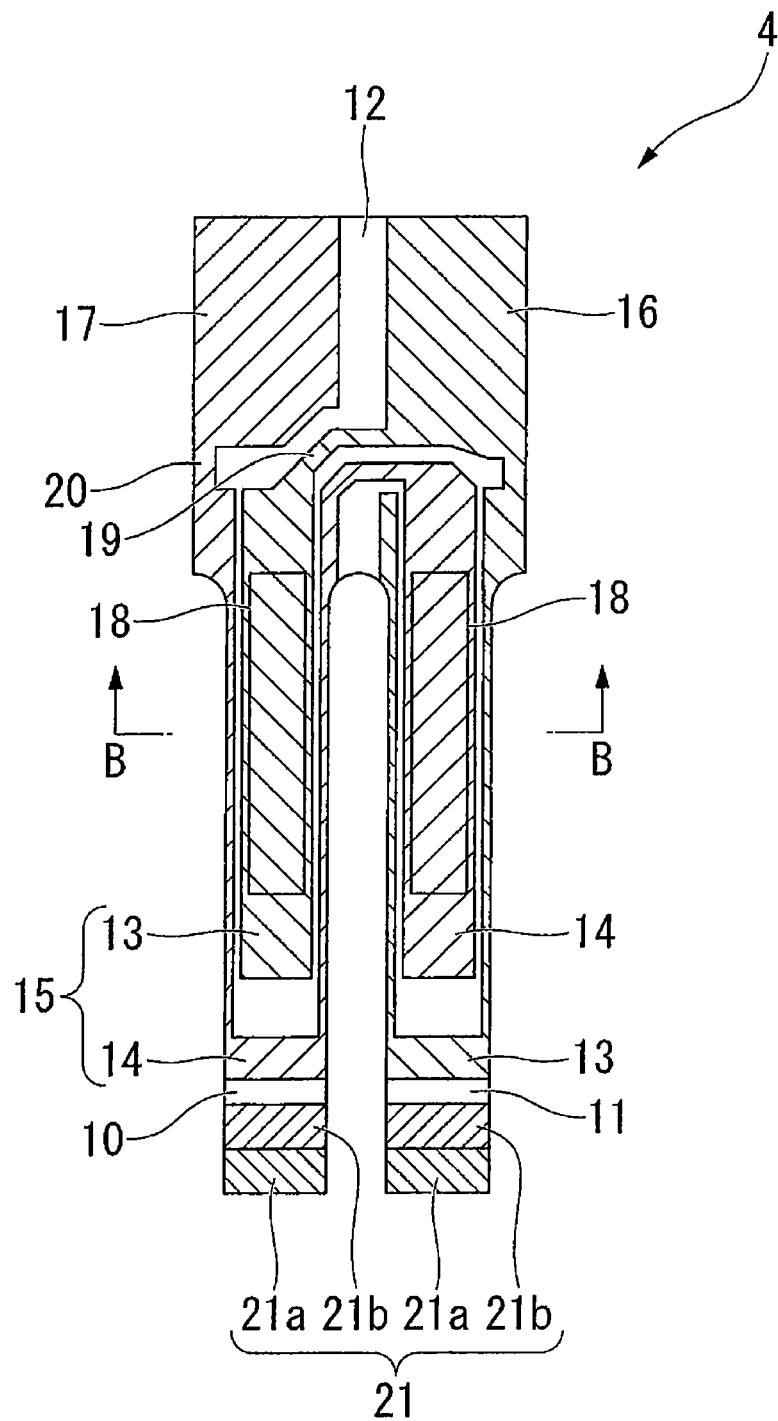
FIG. 5 is a top view of the piezoelectric vibrating reed that constitutes the piezoelectric vibrator shown in FIG. 1.
Figure 6:
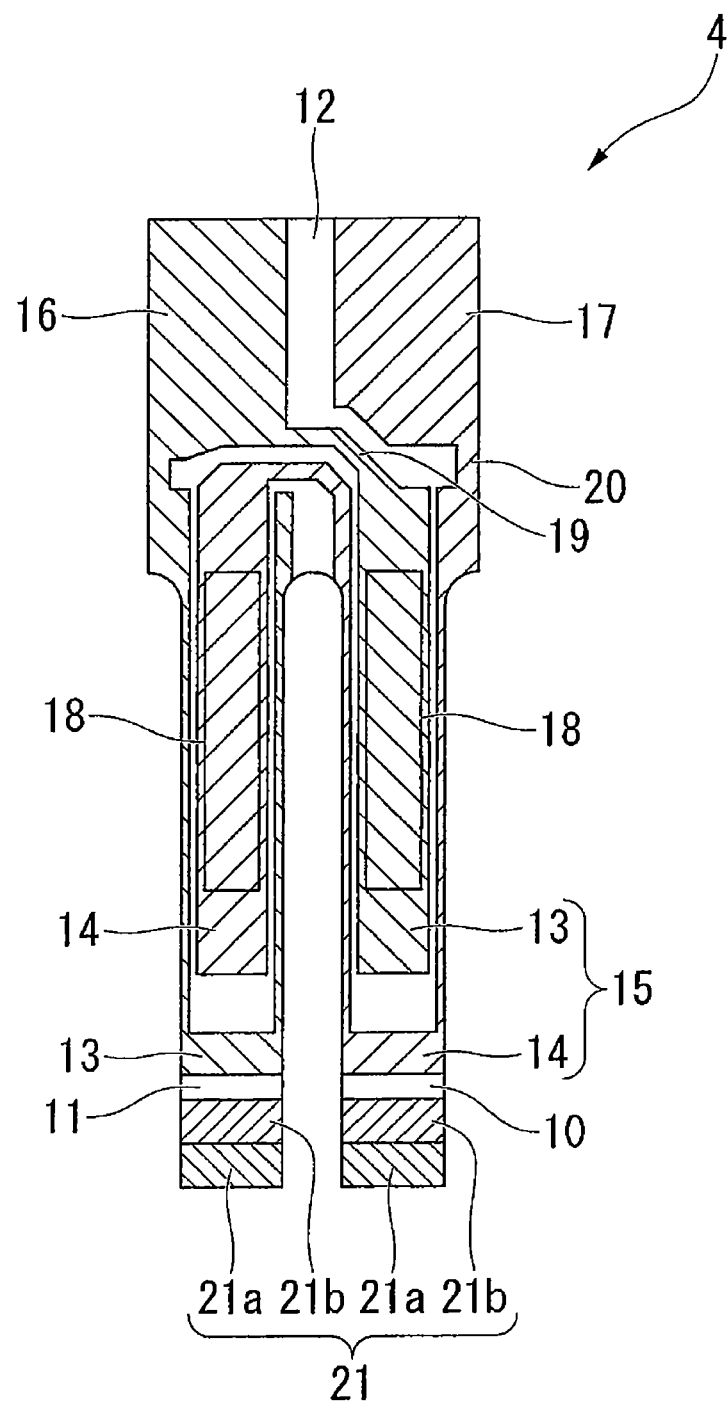
FIG. 6 is a bottom view of the piezoelectric vibrating reed shown in FIG. 5.
Figure 7:
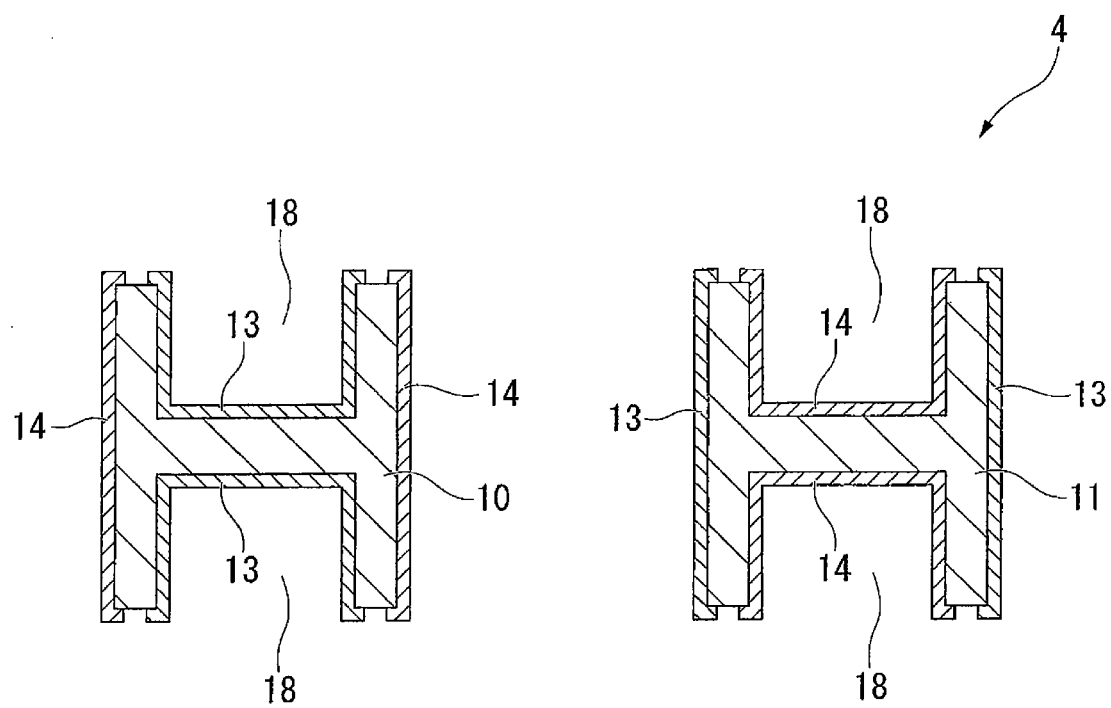
FIG. 7 is a sectional view taken along the line B-B in FIG. 5.

As shown in FIGS. 5 to 7, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto. The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the base ends of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively. The piezoelectric vibrating reed 4 is provided with groove portions 18 which are formed on both principal surfaces of the pair vibrating arms 10 and 11 along the longitudinal direction of the vibrating arms 10 and 11. The groove portions 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction to move closer to or away from each other and is patterned on the outer surfaces of the pair of vibrating arms 10 and 11 in an electrically isolated state. Specifically, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12. A voltage is applied to the piezoelectric vibrating reed 4 via the mount electrodes 16 and 17. The above-mentioned excitation electrode 15, mount electrodes 16 and 17, and extraction electrodes 19 and 20 are formed by a coating of a conductive film of chromium (Cr), nickel (Ni), aluminum (Al), and titanium (Ti), for example.

Furthermore, the tip ends of the pair of the vibrating arms 10 and 11 are coated with a weight metal film 21 for mass adjustment of their own vibration states (tuning the frequency) of the vibrating arms 10 and 11 in a manner such as to vibrate within a predetermined frequency range. The weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal (target) frequency of the device.

The piezoelectric vibrating reed 4 configured in this way is bonded to the base board 2 by a conductive adhesive agent not shown as shown in FIGS. 3 and 4. More specifically, the bonding is achieved in a state where the pair of mount electrodes 16 and 17 comes into contact with lead-out electrodes 36 and 37 described later, respectively, which are patterned (formed) on the inner surface (upper surface which is a bonding surface to be bonded to the lid board 3) of the base board 2. In this way, the piezoelectric vibrating reed 4 is in a state where the mount electrodes 16 and 17 and the lead-out electrodes 36 and 37 are electrically connected to each other.

It should be noted that the piezoelectric vibrating reed 4 may be mounted on the lead-out electrodes 36 and 37 by bump bonding using bumps not shown made of gold or the like.

Piezoelectric Vibrator

As shown in FIGS. 1 to 4, the piezoelectric vibrator 1 according to the present embodiment includes a package 9 in which the base board 2 and the lid board 3 are laminated in two layers.

The base board 2 is a transparent insulating board made of a glass material, for example, soda-lime glass, and is formed in a board-like form.

Figure 2:
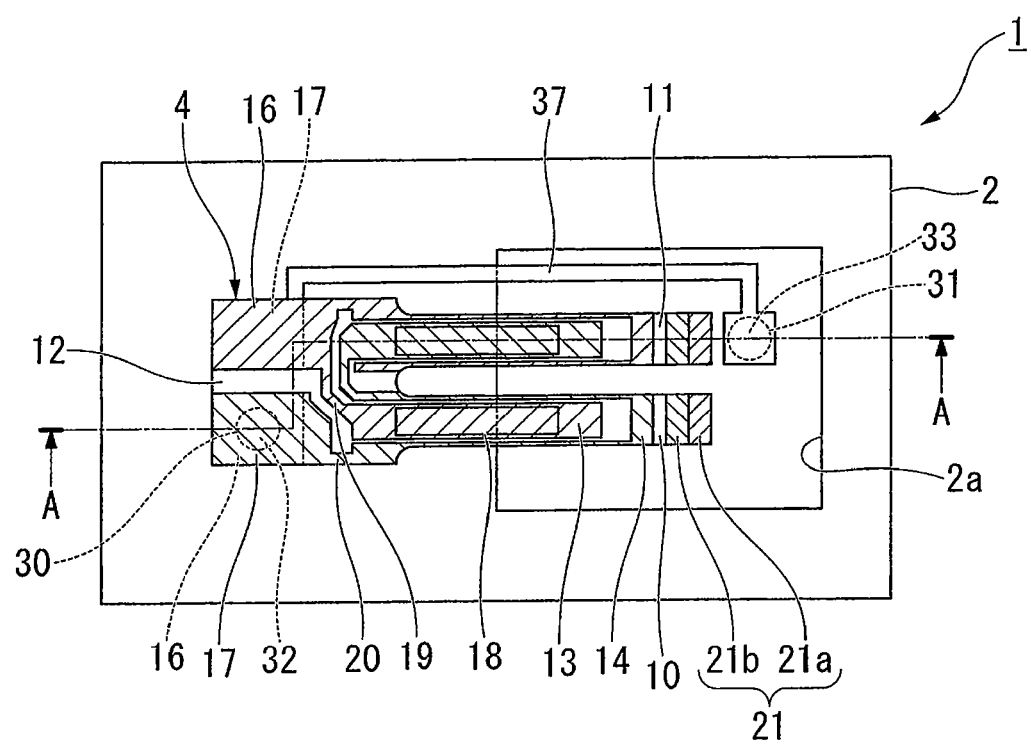
FIG. 2 is a top view showing an inner structure of the piezoelectric vibrator shown in FIG. 1 when a piezoelectric vibrating reed is viewed from above with a lid board removed.

As shown in FIGS. 2 and 3, the base board 2 is formed with a pair of through-holes (penetration holes) 30 and 31 penetrating through the base board 2. The pair of through-holes 30 and 31 is formed at both ends of the diagonal line of the cavity C. The pair of through-holes 30 and 31 are formed with a pair of penetration electrodes 32 and 33 which are formed so as to bury the through-holes 30 and 31. That is to say, the penetration electrodes 32 and 33 are formed to penetrate through the base board 2 from the inner surface side to the outer surface (lower surface) side. The penetration electrodes 32 and 33 are made of a conductive material such as Ag paste. The outer surface of the base board 2 is formed with the pair of outer electrodes 38 and 39 which are electrically connected to the pair of penetration electrodes 32 and 33, respectively.

As shown in FIGS. 2 and 4, the inner surface side of the base board 2 is patterned (formed) by a conductive material (for example, aluminum) so that the pair of lead-out electrodes 36 and 37 is accommodated in the cavity C. The pair of lead-out electrodes 36 and 37 are patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

In the example shown in the drawings, as shown in FIGS. 2 to 4, the inner surface of the base board 2 is formed with a recess portion 2a that constitutes a part of the cavity C. More specifically, the recess portion 2a is formed on a portion of the inner surface positioned on the tip end side of the piezoelectric vibrating reed 4 that is mounted on the base board 2. The recess portion 2a allows the pair of vibrating arms 10 and 11 of the piezoelectric vibrating reed 4 to be floated from the base board 2, and a vibration gap necessary for vibration of the piezoelectric vibrating reed 4 is secured.

The lid board 3 is a transparent insulating board made of glass material, for example, soda-lime glass, similarly to the base board 2, as shown in FIGS. 1, 3, and 4, and is formed in a board-like form having a size capable of being superimposed onto the base board 2, as shown in FIGS. 1 to 4. The inner surface (lower surface which is a bonding surface to be bonded to the base board 2) of the lid board 3 is formed with a rectangular recess portion 3a in which the piezoelectric vibrating reed 4 is accommodated. The recess portion 3a is a recess portion for a cavity serving as the cavity C that accommodates the piezoelectric vibrating reed 4 when the two boards 2 and 3 are superimposed onto each other. The lid board 3 is bonded to the base board 2 in a state where the recess portion 3a faces the base board 2.

As shown in FIGS. 1 to 4, the package 9 (piezoelectric vibrator 1) of the present embodiment is provided with a bonding film 35 which is formed over an entire surface of the lid board 3 facing the base board 2 so as to bond the two boards 2 and 3 to each other at a portion thereof being in contact with the base board 2. As shown in FIGS. 2 and 3, the bonding film 35 of the present embodiment is formed over an entire surface of the surface that defines the recess portion 3a and the peripheral surface of the inner surface of the lid board 2 extending continuously along the outer periphery of the recess portion 3a. Among these surfaces, a portion of the lid board 2 formed on the peripheral portion of the inner surface thereof is anodically bonded to the base board 3. The bonding film 35 is formed of a material (for example, aluminum, silicon, and the like) which is capable of achieving anodic bonding.

When the piezoelectric vibrator 1 configured in this manner is operated, a predetermined drive voltage is applied between the outer electrodes 38 and 39 which are formed on the base board 2. In this way, a voltage can be applied to the excitation electrode 15 including the first excitation electrode 13 and the second excitation electrode 14 of the piezoelectric vibrating reed 4, and the pair of vibrating arms 10 and 11 is allowed to vibrate at a predetermined frequency in a direction to move closer to or away from each other. This vibration of the pair of vibrating arms 10 and 11 can be used as the time source, the timing source of a control signal, the reference signal source, and the like.

Manufacturing Method of Piezoelectric Vibrator

Figure 8:
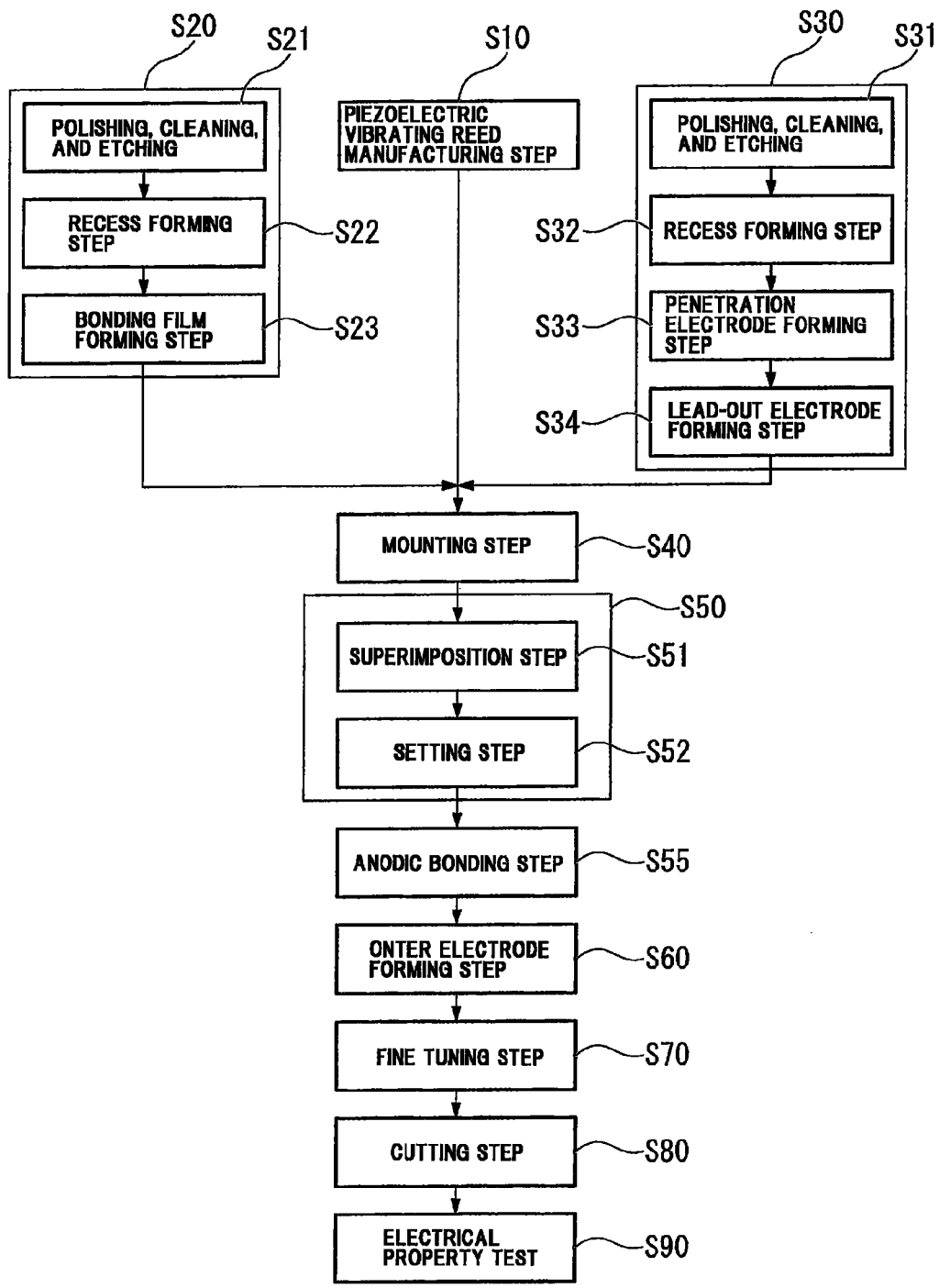
FIG. 8 is a flowchart showing the flow of the manufacturing process of the piezoelectric vibrator shown in FIG. 1.

Next, a method for manufacturing a plurality of the above-described piezoelectric vibrators 1 at a time using a base board wafer (base board) 40 and a lid board wafer (lid board) 50 will be described with reference to the flowchart shown in FIG. 8. Although in the present embodiment, a plurality of piezoelectric vibrators 1 is manufactured at a time using wafer-shaped boards, the present invention is not limited to this. For example, one piezoelectric vibrator may be manufactured at a time using boards which are processed to comply with the outer dimensions of the base board 2 and the lid board 3 in advance.

First, a piezoelectric vibrating reed manufacturing step is performed to manufacture the piezoelectric vibrating reed 4 shown in FIGS. 5 to 7 (S10). Specifically, first, a rough quartz crystal Lambert is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured.

Moreover, after the piezoelectric vibrating reed 4 is manufactured, rough tuning of a resonance frequency is performed. This rough tuning is achieved by irradiating the rough tuning film 21a of the weight metal film 21 with a laser beam to evaporate in part the rough tuning film 21a, thus changing the weight thereof. Fine tuning of adjusting the resonance frequency more accurately is performed after a mounting step is performed. This fine tuning will be described later.

Figure 9:
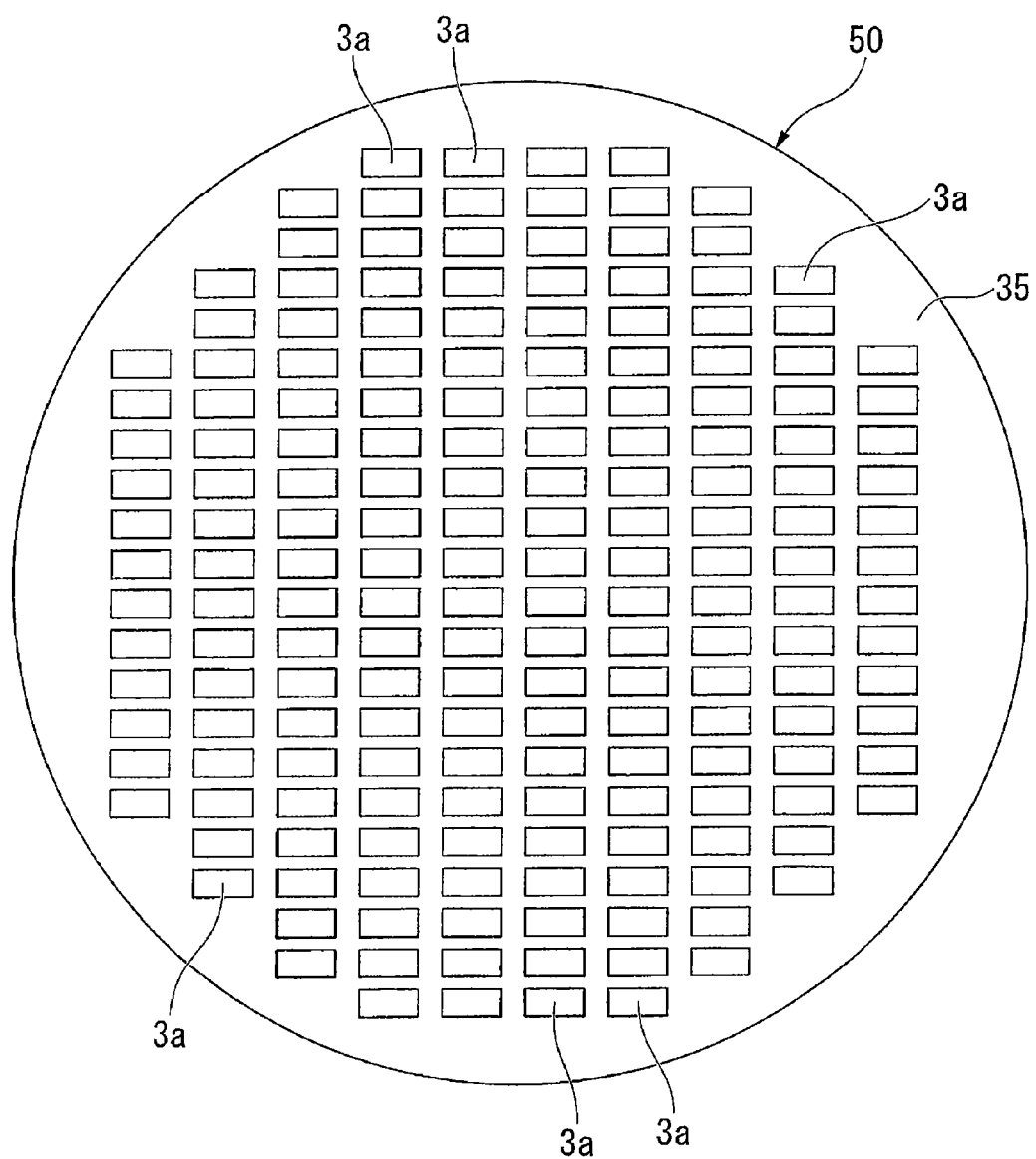
FIG. 9 is a view showing one step of the manufacturing process of the piezoelectric vibrator in accordance with the flowchart shown in FIG. 8, showing a state where a plurality of recess portions and a bonding film are formed on a lid board wafer serving as a base material of a lid board.

Subsequently, a first wafer manufacturing step is performed where the lid board wafer 50 later serving as the lid board 3 is manufactured up to a stage immediately before anodic bonding is achieved (S20). In this step, first, a disk-shaped lid board wafer 50 is formed by polishing a soda-lime glass to a predetermined thickness, cleaning the polished glass, and removing an affected uppermost layer by etching or the like (S21). Subsequently, as shown in FIG. 9, a recess forming step is performed where a plurality of recess portions 3a to be used as a cavity C is formed in a matrix form on the inner surface of the lid board wafer 50 by etching or the like (S22). After that, a bonding film forming step is performed where a bonding film 35 is formed over the entire surface on the inner surface side of the lid board wafer 50 where the recess portions 3a are formed (S23). At that time, the bonding film 35 is formed, for example, by deposition, sputtering, and the like.

The first wafer manufacturing step ends at this point in time.

Subsequently, at the same or a different time as the first wafer manufacturing step, a second wafer manufacturing step is performed where a base board wafer 40 later serving as the base board 2 is manufactured up to a stage immediately before anodic bonding is achieved (S30). In this step, first, a disk-shaped base board wafer 40 is formed by polishing a soda-lime glass to a predetermined thickness, cleaning the polished glass, and removing an affected uppermost layer by etching or the like (S31). Subsequently, a recess forming step is performed where a plurality of recess portions 2a to be used as a cavity C is formed in a matrix form on the inner surface of the base board wafer 40 by etching or the like (S32). At that time, the recess portions 2a are formed so as to be positioned on the tip end sides of the vibrating arms 10 and 11 of the piezoelectric vibrating reed 4.

Subsequently, a penetration electrode forming step is performed where a plurality of pairs of penetration electrodes 32 and 33 is formed on the base board wafer 40 (S33). Specifically, first, a plurality of pairs of through-holes 30 and 31 is formed by a sand blast method, press working, and the like. Then, a pair of penetration electrodes 32 and 33 is formed in the plurality of pairs of through-holes 30 and 31. With the pair of penetration electrodes 32 and 33, the pair of through-holes 30 and 31 can be sealed, and electrical conduction between the inner surface side and the outer surface side of the base board wafer 40 can be secured.

Figure 10:
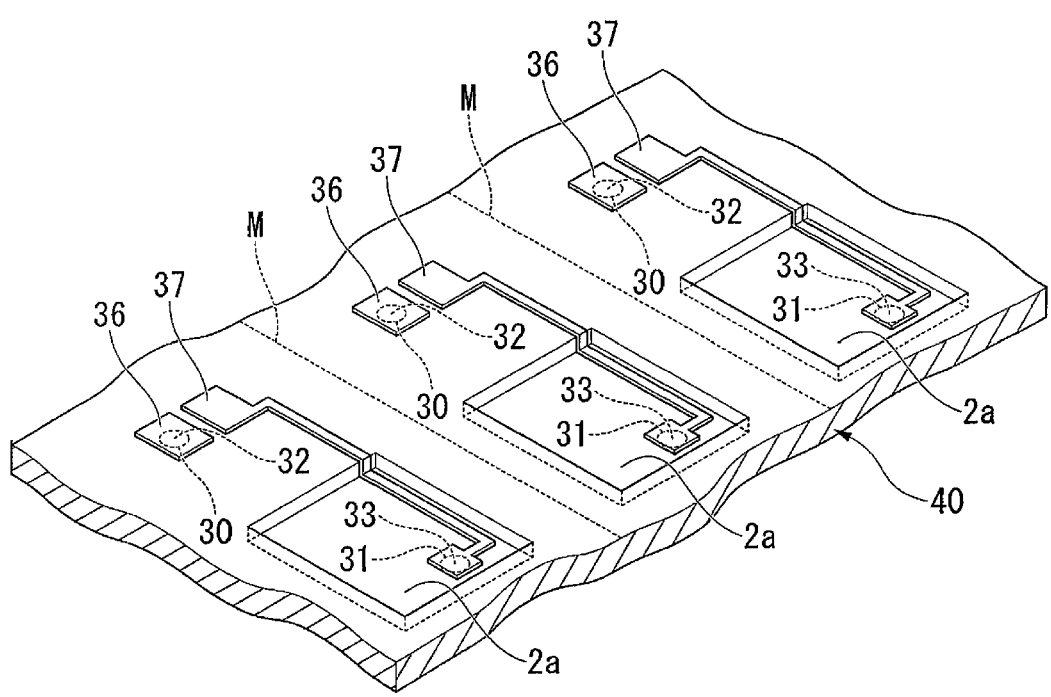
FIG. 10 is a view showing one step of the manufacturing process of the piezoelectric vibrator in accordance with the flowchart shown in FIG. 8, showing a state where recess portions, penetration electrodes, and lead-out electrodes are formed on a base board wafer serving as a base material of a base board.
Figure 11:
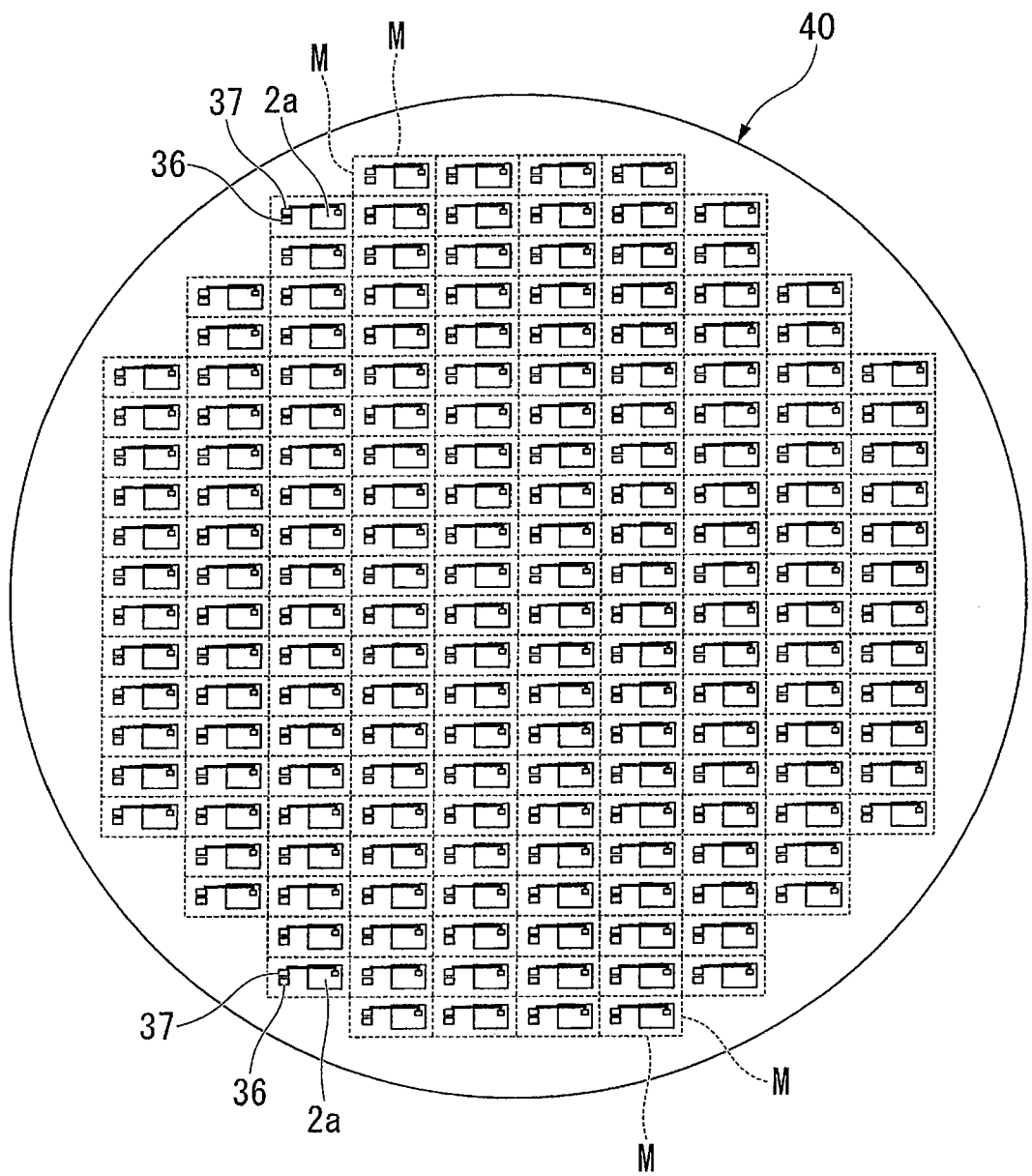
FIG. 11 is an overall view of the base board wafer in the state shown in FIG. 10.

Subsequently, as shown in FIGS. 10 and 11, a lead-out electrode forming step is performed where a conductive material is patterned on the inner surface of the base board wafer 40 so as to form a plurality of lead-out electrodes 36 and 37 which are electrically connected to each pair of the penetration electrodes 32 and 33 (S34). The dotted line M shown in FIGS. 10 and 11 is a cutting line along which a cutting step performed later is achieved.

The second wafer manufacturing step ends at this point in time.

Subsequently, a mounting step (piezoelectric vibrating reed mounting step) is performed where the piezoelectric vibrating reed 4 is electrically connected to the lead-out electrodes 36 and 37 so that the piezoelectric vibrating reed 4 is accommodated in the cavity C in a superimposition step described later (S40). In the present embodiment, a plurality of manufactured piezoelectric vibrating reeds 4 is bonded to the inner surface of the base board wafer 40 via the lead-out electrodes 36 and 37. In this way, the piezoelectric vibrating reed 4 is in a state where the mount electrodes 16 and 17 are electrically connected to the lead-out electrodes 36 and 37. Therefore, the pair of excitation electrodes 15 of the piezoelectric vibrating reed 4 are in a state of being electrically connected to the pair of penetration electrodes 32 and 33.

Figure 12:
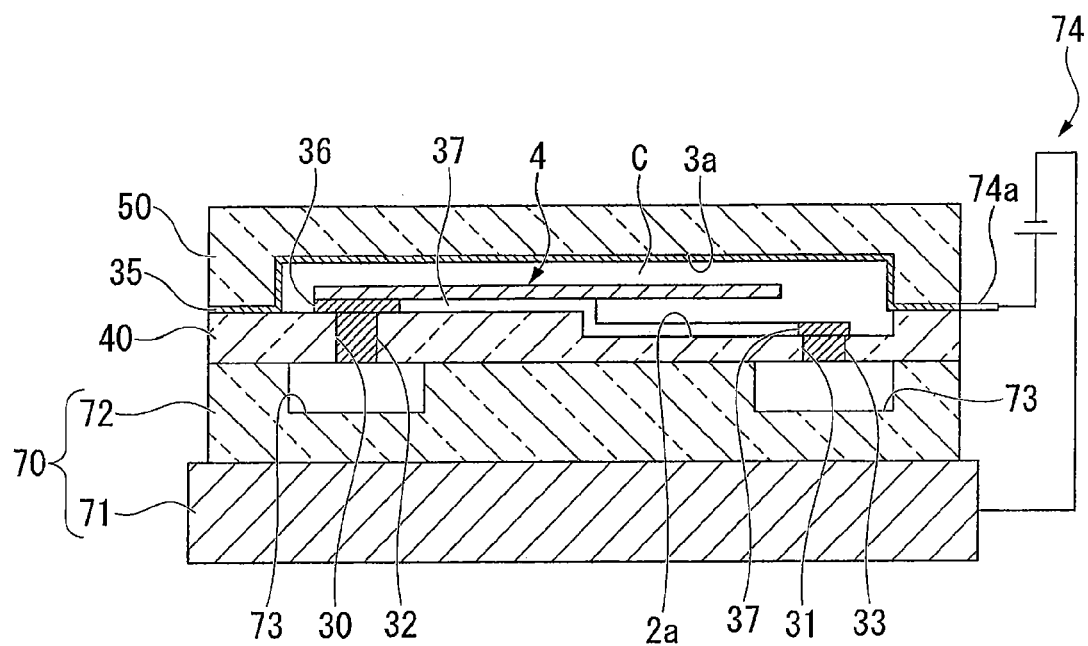
FIG. 12 is a view showing one step of the manufacturing process of the piezoelectric vibrator in accordance with the flowchart shown in FIG. 8, illustrating an anodic bonding step.

Subsequently, as shown in FIG. 12, an alignment step is performed where the inner surface of the lid board wafer 50 is superimposed onto the inner surface of the base board wafer 40, and the outer surface of the base board wafer 40 is aligned on an electrode base portion 70 for anodic bonding (S50).

Here, prior to description of the alignment step, the electrode base portion 70 for anodic bonding will be described.

As shown in FIG. 12, the electrode base portion 70 constitutes one electrode that serves as a negative terminal among a pair of electrodes of an application means 74 for anodic bonding which is provided in an anodic bonding machine not shown. In the example shown in the drawing, the other electrode that serves as a positive terminal among the pair of electrodes is configured as a film electrode 74a which is electrically connected to the bonding film 35. In FIG. 12, portions of the base board wafer 40 and the lid board wafer 50 corresponding to only one piezoelectric vibrator 1 are illustrated.

The electrode base portion 70 includes an electrode base body 71 and a dummy member 72 which is made of a material whose inner ions are capable of moving at a bonding temperature (for example, 200° C. to 300° C.) and is arranged on the electrode base body 71, and in which void portions 73 are formed.

The electrode base body 71 is a conductive board-like member that is formed with dimensions equal to those of the base board wafer 40 or larger than those of the base board wafer 40 in plan view thereof. As an example material of the conductive board-like member, stainless steel (SUS) can be mentioned.

The dummy member 72 is a board-like member that is made of a glass material, for example, and formed in approximately the same shape as the base board wafer 40 in plan view thereof, and is detachably mounted on the electrode base body 71. In the present embodiment, a thermal expansion coefficient of the dummy member 72 is equal to a thermal expansion coefficient of the base board wafer 40. In the example shown in the drawing, the dummy member 72 and the base board wafer 40 are made of the same glass material, and the thermal expansion coefficient of the dummy member 72 is equal to the thermal expansion coefficient of the base board wafer 40.

In addition, in the present embodiment, the void portions 73 are configured as a plurality of recess portions which is formed on the upper surface (outer surface) of the dummy member 72 at intervals. In the example shown in the drawing, the thickness which is the dimension in the normal direction of the dummy member 72 is equal to the thickness of the base board wafer 40, for example, and the depth of the void portions 73 is about half of the thickness of the dummy member 72. For example, the thickness of the dummy member 72 is about 400 μm, and the depth of the void portions 73 is about 200 μm.

Next, the alignment step will be described in detail.

First, as shown in FIG. 12, a superimposition step is performed where the lid board wafer 50 is superimposed onto the base board wafer 40 (S51). Specifically, both wafers 40 and 50 are aligned at a correct position using reference marks or the like not shown in the figure as indices. In this way, the mounted piezoelectric vibrating reed 4 is accommodated in the cavity C which is formed between both wafers 40 and 50.

Subsequently, a setting step is performed where the two superimposed wafers 40 and 50 are inserted into the anodic bonding machine and placed (disposed) on the dummy member 72 with the base board wafer 40 facing the dummy member 72 (S52). At that time, the wafers are placed with the base board wafer 40 positioned so that the penetration electrodes 32 and 33 are exposed to the void portions 73. In the example shown in the drawing, corresponding one of the penetration electrodes 32 and 33 is exposed to each of the void portions 73. In addition, over the entire portion of the bonding film 35 being in contact with the base board wafer 40, the base board wafer 40 is interposed between the electrode base portion 70 and the bonding film 35.

In addition, in the present embodiment, during the setting step, the film electrode 74a of the application means 74 is electrically connected to the bonding film 35.

In this way, the alignment step ends.

Subsequently, an anodic bonding step is performed where a bonding voltage (for example, 600 V to 800 V) is applied between the bonding film 35 and the electrode base portion 70 while heating them to a bonding temperature to achieve anodic bonding of the bonding film 35 and the base board wafer 40 (S55). Here, the anodic bonding step involves applying the bonding voltage in a state where the penetration electrodes 32 and 33 are exposed to the void portions 73 formed on the electrode base portion 70. Furthermore, in the present embodiment, the anodic bonding step involves applying the bonding voltage between the electrode base body 71 and the bonding film 35 while heating them to a bonding temperature.

Figure 13:
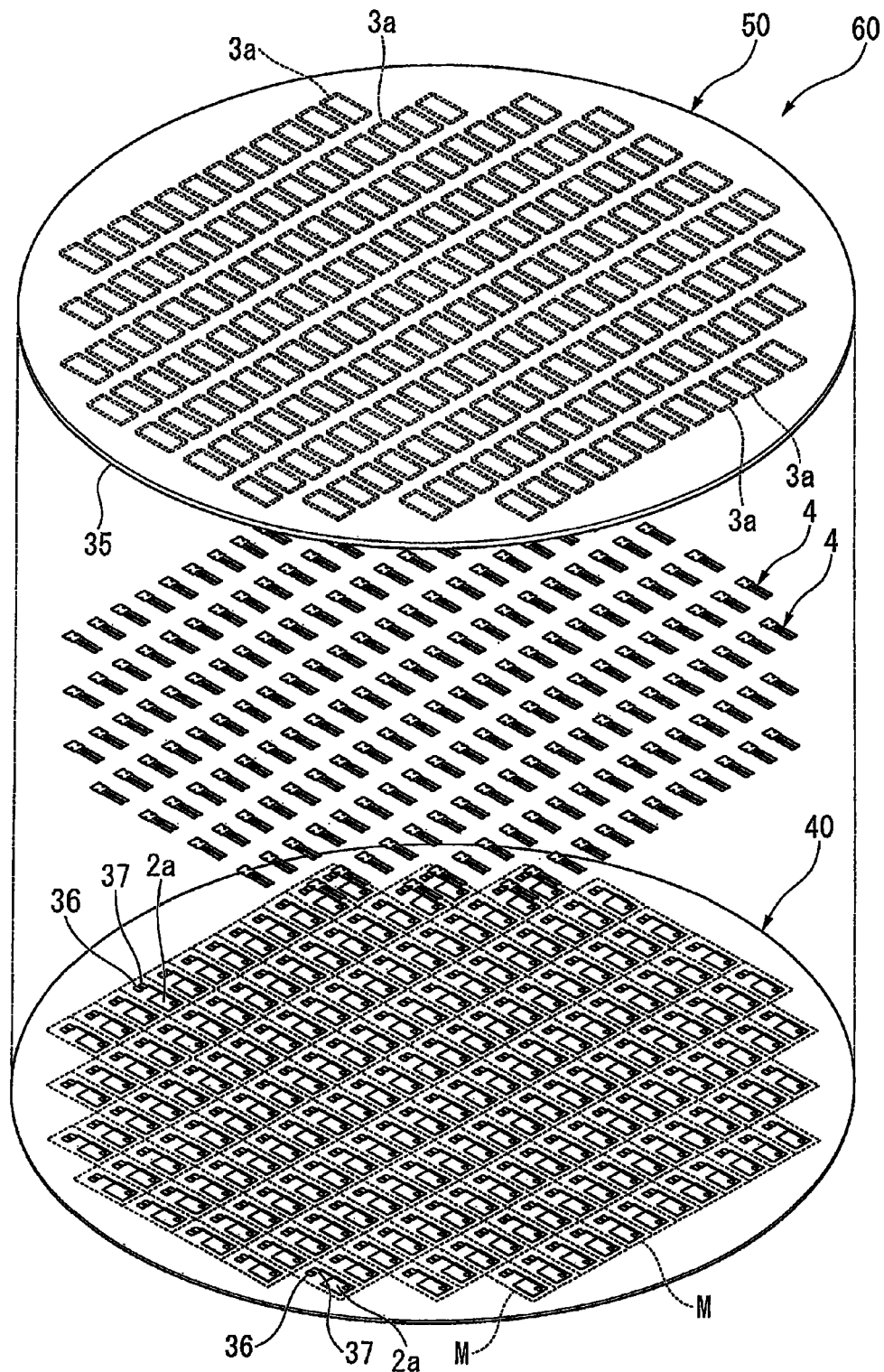
FIG. 13 is a view showing one step of the manufacturing process of the piezoelectric vibrator in accordance with the flowchart shown in FIG. 8, and is also an exploded perspective view of a wafer assembly in which the base board wafer and the bonding film are anodically bonded with the piezoelectric vibrating reed accommodated in a cavity.

By doing so, an electrochemical reaction occurs at an interface between the bonding film 35 and the base board wafer 40, and they are anodically bonded to each other. In this way, it is possible to obtain a wafer assembly 60 as shown in FIG. 13 in which the piezoelectric vibrating reed 4 is sealed in the cavity C, and the base board wafer 40 is bonded to the lid board wafer 50. In FIG. 13, for better understanding of the figure, the wafer assembly 60 is illustrated in an exploded state. The dotted line M shown in FIG. 13 is a cutting line along which a cutting step performed later is achieved.

After the above-described anodic bonding is completed, an outer electrode forming step is performed where a conductive material is patterned onto the outer surface of the base board wafer 40 so as to form a plurality of pairs of outer electrodes 38 and 39 which is electrically connected to the pair of penetration electrodes 32 and 33 (S60). By this step, the piezoelectric vibrating reed 4 which is sealed in the cavity C can be operated using the outer electrodes 38 and 39.

Subsequently, a fine tuning step is performed on the wafer assembly 60 where the frequencies of the individual piezoelectric vibrating reeds 4 sealed in the cavities C are tuned finely to fall within a predetermined range (S70). Specifically, a voltage is applied to the pair of outer electrodes 38 and 39 which are formed on the outer surface of the base board wafer 40, thus allowing the piezoelectric vibrating reeds 4 to vibrate. A laser beam is irradiated onto the base board wafer 40 from the outer side while measuring the vibration frequencies to evaporate the fine tuning film 21b of the weight metal film 21. In this way, since the weight on the tip end sides of the pair of vibrating arms 10 and 11 is changed, the fine tuning can be performed in such a way that the frequency of the piezoelectric vibrating reed 4 falls within the predetermined range of the nominal frequency.

After the fine tuning of the frequency is completed, a cutting step is performed where the bonded wafer assembly 60 is cut along the cutting line M shown in FIG. 13 to obtain small fragments (S80). As a result, a plurality of two-layered SMD-type piezoelectric vibrators 1 shown in FIG. 1, in which the piezoelectric vibrating reed 4 is sealed in the cavity C of the package 9, can be manufactured at a time.

The fine tuning step (S70) may be performed after performing the cutting step (S80) to obtain the individual fragments of the piezoelectric vibrators 1. However, as described above, by performing the fine tuning step (S70) earlier, since the fine tuning step can be performed on the wafer assembly 60, it is possible to perform the fine tuning on the plurality of piezoelectric vibrators 1 more efficiently. Therefore, it is desirable because throughput can be increased.

Subsequently, an inner electrical property test is conducted (S90). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are checked as well. Finally, an external appearance test of the piezoelectric vibrator 1 is conducted to check the dimensions, the quality, and the like. In this way, the manufacturing of the piezoelectric vibrator 1 ends.

As described above, according to the manufacturing method of the piezoelectric vibrator according to the present embodiment, since the penetration electrodes 32 and 33 are exposed to the void portions 73 during the anodic bonding step, no current will flow directly from the electrode base portion 70 to the penetration electrodes 32 and 33. That is, when the bonding voltage is applied between the bonding film 35 and the electrode base portion 70 during the anodic bonding step, it is possible to suppress current from flowing to the penetration electrodes 32 and 33 and suppress occurrence of a large potential difference between the bonding film 35 and the piezoelectric vibrating reed 4 electrically connected to the lead-out electrodes 36 and 37. Therefore, it is possible to suppress occurrence of a discharge phenomenon (spark discharge) between the bonding film 35 and the piezoelectric vibrating reed 4. In this way, it is possible to secure a sufficient amount of current flowing to the bonding film 35 and the base board wafer 40 and achieve stable anodic bonding of the base board wafer 40 and the bonding film 35.

In addition, the dummy member 72 is made of a material whose inner ions are capable of moving at the bonding temperature, and during the anodic bonding step, the bonding voltage is applied between the electrode base body 71 and the bonding film 35 while heating them to the bonding temperature. Therefore, the ions (charged particles) are allowed to move and current flows in the dummy member 72, whereby an electrochemical reaction can occur at an interface between the bonding film 35 and the base board wafer 40. In this way, it is possible to achieve anodic bonding of the base board wafer 40 and the bonding film 35.

In addition, since the electrode base portion 70 includes the dummy member 72 arranged on the electrode base body 71, it is possible to separate the penetration electrodes 32 and 33 and the electrode base body 71 from each other during the anodic bonding step by a distance corresponding to the dummy member 72. Thus, it is possible to suppress occurrence of a discharge phenomenon between the penetration electrodes 32 and 33 and the electrode base body 71.

Figure 14:
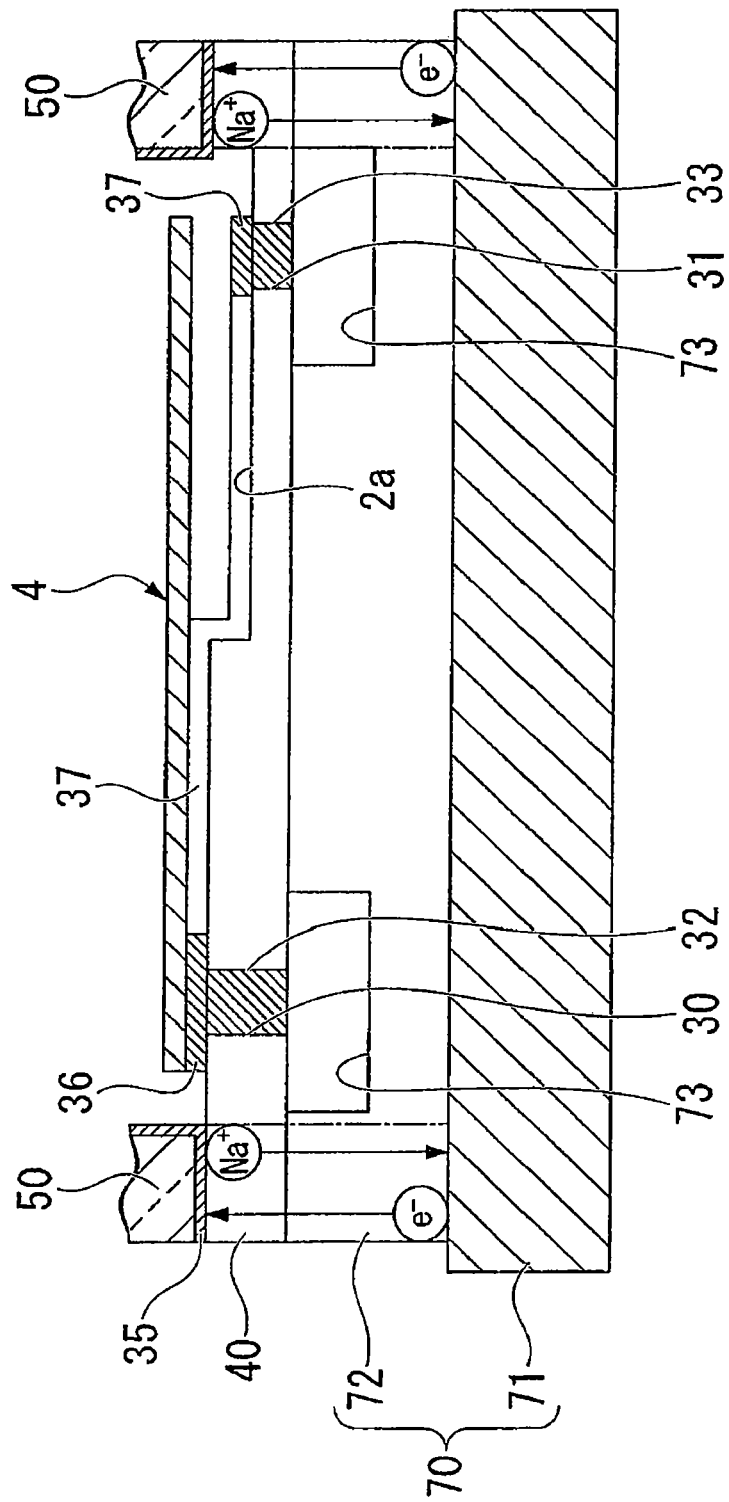
FIG. 14 is a view illustrating the movement of ions in the base board in the state shown in FIG. 12 and a dummy member.

As in the case of the present embodiment in which the electrode base portion 70 serves as the negative terminal of the application means 74, and the bonding film 35 is connected to the film electrode 74a which is the positive terminal of the application means 74, as shown in FIG. 14, sodium ions in the glass material that forms the base board wafer 40 and the dummy member 72 move in a direction from the bonding film 35 side to the dummy member 72 side, and electrons move in the opposite direction.

In addition, since the thermal expansion coefficient of the dummy member 72 is equal to the thermal expansion coefficient of the base board wafer 40, the base board wafer 40 and the dummy member 72 will experience the same thermal expansion when they are heated in the anodic bonding step. Therefore, it is possible to suppress a relative positional shift between the penetration electrodes 32 and 33 and the void portions 73 resulting from the thermal expansion. Thus, it is possible to stably secure a state where the penetration electrodes 32 and 33 are exposed to the void portions 73.

According to the piezoelectric vibrator 1 according to the present embodiment, since the piezoelectric vibrator 1 is manufactured by the manufacturing method described above, it is possible to achieve stable anodic bonding of the base board wafer 40 and the bonding film 35. Thus, it is possible to secure air-tightness of the inside of the cavity C and achieve high quality of the piezoelectric vibrator 1.

While in the present embodiment, corresponding one of the penetration electrodes 32 and 33 is exposed to each of the void portions 73 formed on the dummy member 72 during the alignment step, the present invention is not limited to this. For example, the void portions may be formed so that a plurality of penetration electrodes 32 and 33 is exposed to one void portion. In this case, the lid board wafer 50 having the recess portion 3a, for example, may be used as the dummy member.

In addition, although in the present embodiment, the base board wafer 40 and the lid board wafer 50 superimposed during the superimposition step are placed on the dummy member 72 during the setting step, the present invention is not limited to this. For example, after the base board wafer 40, the lid board wafer 50, and the dummy member 72 are superimposed onto each other during the superimposition step, they may be disposed on the electrode base body 71 with the dummy member 72 facing the electrode base body 71.

Furthermore, the electrode base body 71 may be configured as an electrode that can be detachable from the application means 74, and after the base board wafer 40, the lid board wafer 50, and the electrode base portion 70 are superimposed onto each other at the outside of the anodic bonding machine, they may be inserted into the anodic bonding machine.

Furthermore, although in the present embodiment, the dummy member 72 is detachable from the electrode base body 71, the present invention is not limited to this.

In addition, although in the present embodiment, the electrode base portion 70 constitutes one electrode that serves as the negative terminal among the pair of electrodes of the application means 74, the electrode base portion 70 may serve as the positive terminal.

In addition, although in the present embodiment, the thermal expansion coefficient of the dummy member 72 is equal to the thermal expansion coefficient of the base board wafer 40, the present invention is not limited to this.

Figure 15:
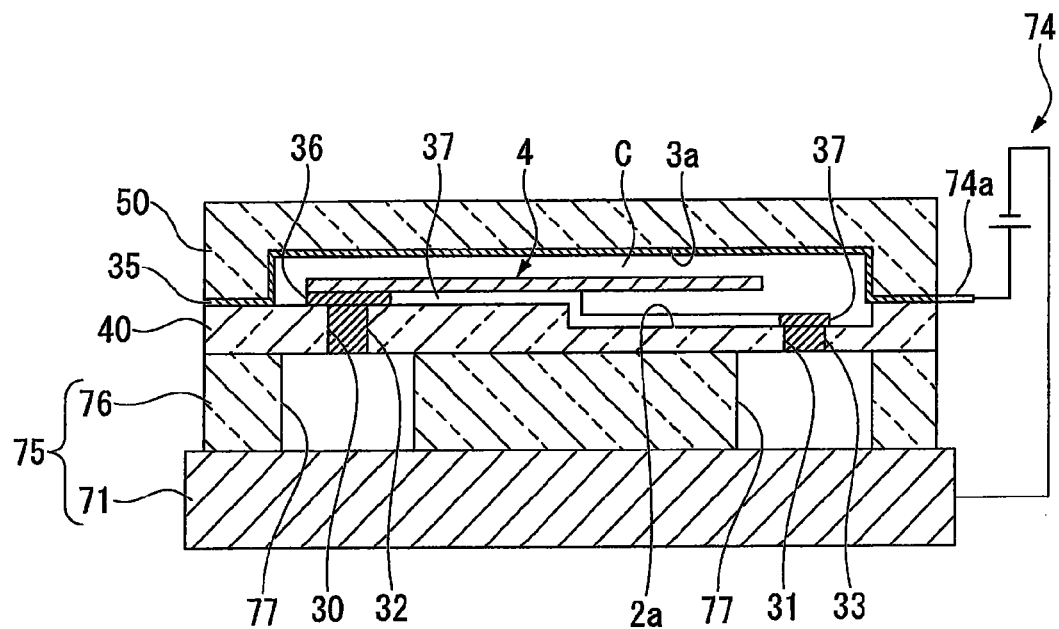
FIG. 15 is a view showing a method for manufacturing a piezoelectric vibrator according to a modification of the embodiment of the present invention, illustrating an anodic bonding step.

In addition, although in the present embodiment, the void portions 73 are configured as recess portions, the present invention is not limited to this. For example, as in the case of an electrode base portion 75 shown in FIG. 15, void portions 77 formed in a dummy member 76 may be penetration holes that penetrate through the base board wafer 40.

Figure 16:
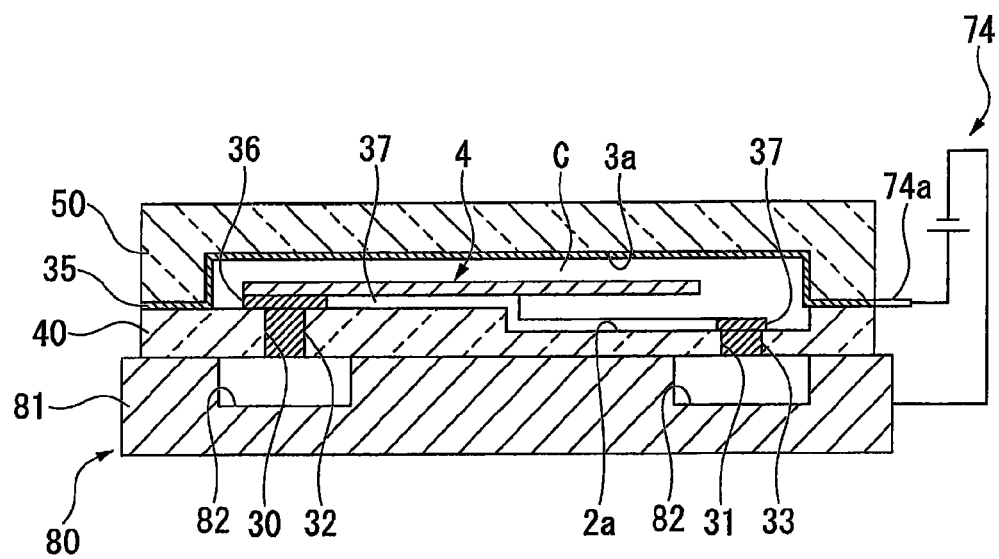
FIG. 16 is a view showing a method for manufacturing a piezoelectric vibrator according to another modification of the embodiment of the present invention, illustrating an anodic bonding step.

In addition, although in the present embodiment, the electrode base portion 70 includes the dummy member 72, the present invention is not limited to this. For example, as in the case of an electrode base portion 80 shown in FIG. 16, the electrode base portion 80 may be configured by an electrode base body 81. In the example shown in the drawing, void portions 82 are formed on the upper surface of the electrode base body 81.

Figure 17:
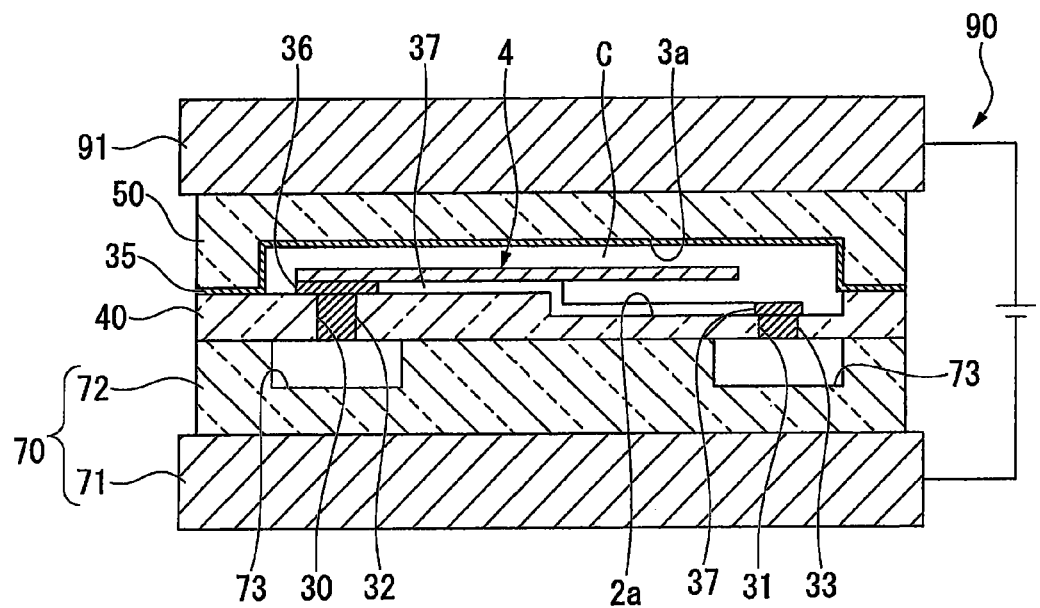
FIG. 17 is a view showing a method for manufacturing a piezoelectric vibrator according to another modification of the embodiment of the present invention, illustrating an anodic bonding step.

In addition, although in the present embodiment, among the pair of electrodes of the application means 74 for anodic bonding, the other electrode on the different side from the electrode base portion 70 serves as the film electrode 74a that is electrically connected to the bonding film 35, the present invention is not limited to this. For example, as in the case of an application means 90 shown in FIG. 17, the other electrode may be an electrode board 91 that is disposed on the outer surface (upper surface) of the lid board wafer 50. In this case, the application means 90 can also apply the bonding voltage between the bonding film 35 and the electrode base portion 70 via the electrode board 91 and the lid board wafer 50.

Oscillator

Next, an oscillator according to an embodiment of the present invention will be described with reference to FIG. 18.

Figure 18:
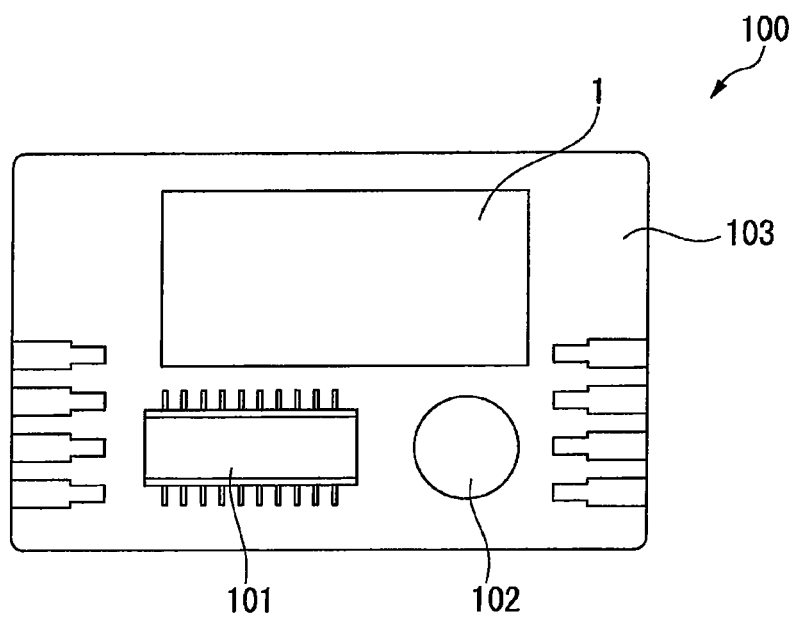
FIG. 18 is a view showing the configuration of an oscillator according to an embodiment of the present invention.

As shown in FIG. 18, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrator 1 is mounted in the vicinity of the integrated circuit 101. The electronic component 102, the integrated circuit 101, and the piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Timepiece) module, according to the demands, it is possible to add a function of controlling the date or time for operating the device or an external device or providing the time or calendar other than a single-function oscillator for a timepiece.

According to the present embodiment, since the oscillator 100 includes the piezoelectric vibrator 1 which has high quality, it is possible to achieve high quality of the oscillator 100.

Electronic Device

Figure 19:
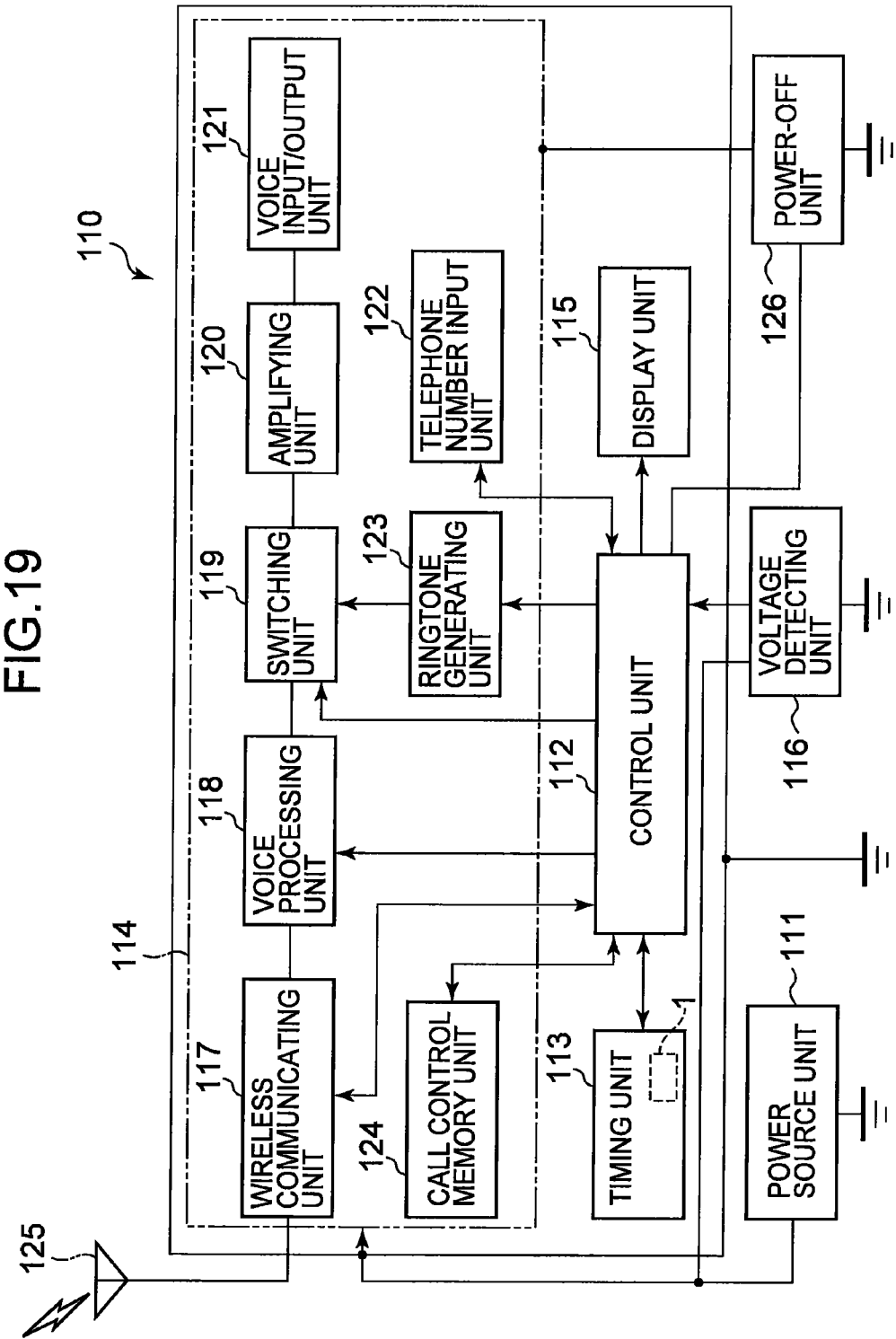
FIG. 19 is a view showing the configuration of an electronic device according to an embodiment of the present invention.

Next, an electronic device according to an embodiment of the present invention will be described with reference to FIG. 19. The present embodiment will be described by way of the example of a portable information device 110 having the piezoelectric vibrator 1 as an example of the electronic device. First, the portable information device 110 of the present embodiment is represented, for example, by a cellular phone and is one that develops and improves upon a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and performs communication as with a cellular phone of the related art using the internal speaker and microphone on the inner side of its strap. However, the portable information device is remarkably small and light compared with the cellular phone of the related art.

Next, the configuration of the portable information device 110 of the present embodiment will be described. As shown in FIG. 19, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that measures the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive audio data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric properties of the quartz crystal and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, an audio processing portion 118, a switching portion 119, an amplifier portion 120, an audio input/output portion 121, a telephone number input portion 122, a ring tone generation portion 123, and a call control memory portion 124.

The wireless portion 117 carries out transmission and reception of various kinds of data, such as audio data, with the base station via an antenna 125. The audio processing portion 118 encodes and decodes an audio signal input therein from the wireless portion 117 or the amplifier portion 120. The amplifier portion 120 amplifies a signal input therein from the audio processing portion 118 or the audio input/output portion 121 to a specific level. The audio input/output portion 121 is formed of a speaker and a microphone and the like, and makes a ring tone and incoming audio louder, as well as collecting audio.

The ring tone generation portion 123 generates a ring tone in response to a call from the base station. The switching portion 119 switches the amplifier portion 120 normally connected to the audio processing portion 118 to the ring tone generation portion 123 only when a call arrives, so that the ring tone generated in the ring tone generation portion 123 is output to the audio input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys and the like.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, is about 3 V. Upon receipt of a notification of a voltage drop from the voltage detection portion 116, the control portion 112 disables the operation of the wireless portion 117, the audio processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the present embodiment, since the portable information device 110 includes the piezoelectric vibrator 1 which has high quality, it is possible to achieve high quality of the portable information device 110.

Radio-Controlled Timepiece

Next, a radio-controlled timepiece according to an embodiment of the present invention will be described with reference to FIG. 20.

Figure 20:
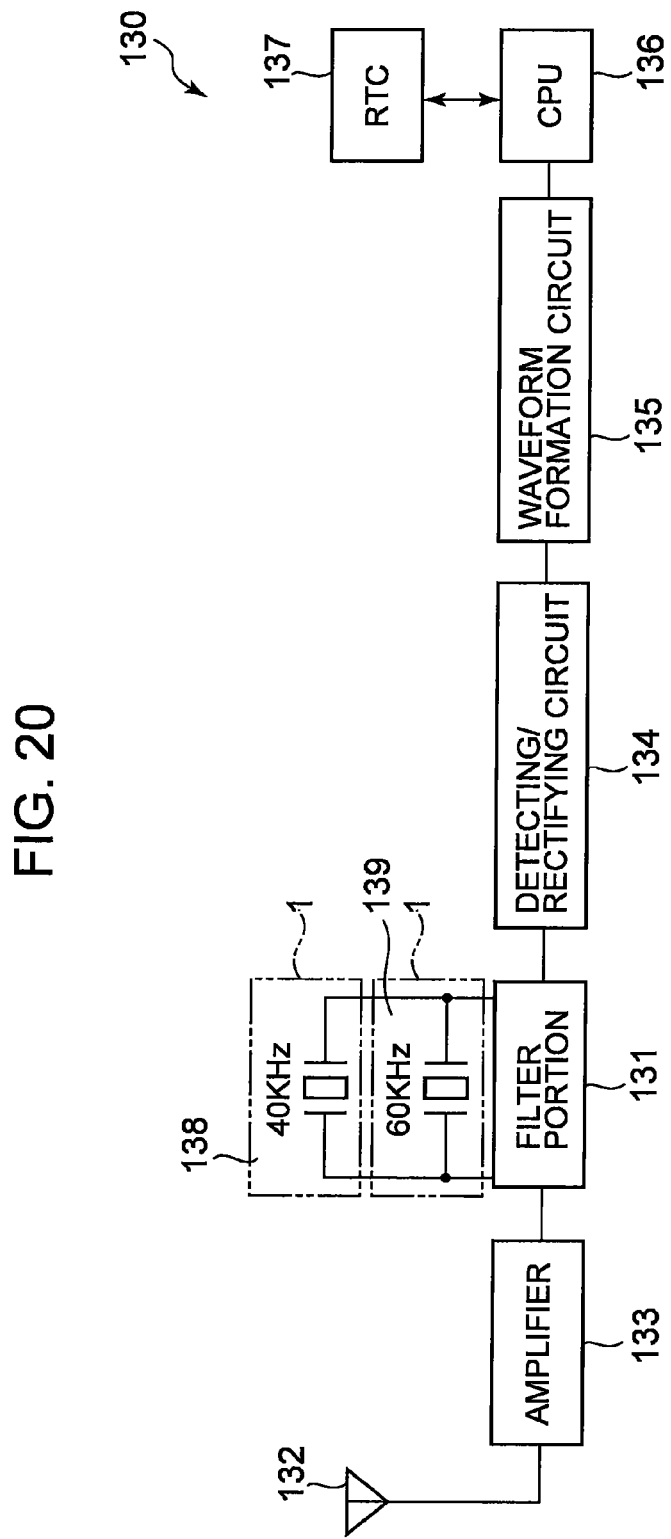
FIG. 20 is a view showing the configuration of a radio-controlled timepiece according to an embodiment of the present invention.
Figure 21:
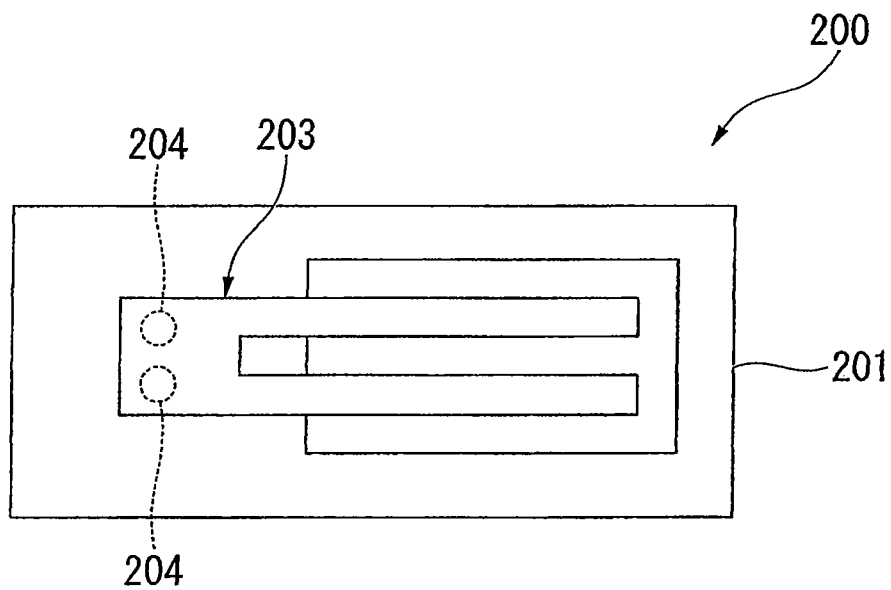
FIG. 21 is a top view showing an inner structure of a piezoelectric vibrator according to the related art when a piezoelectric vibrating reed is viewed from above with a lid board removed.
Figure 22:
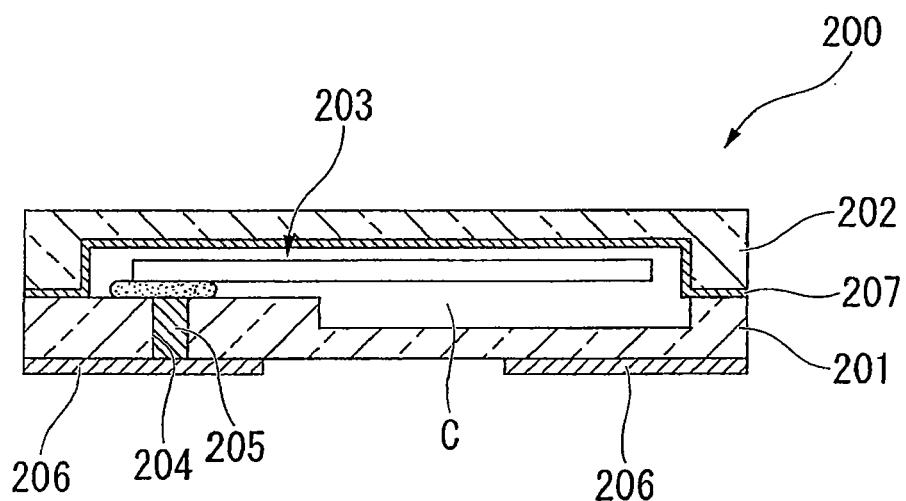
FIG. 22 is a sectional view of the piezoelectric vibrator shown in FIG. 21.
Figure 23:
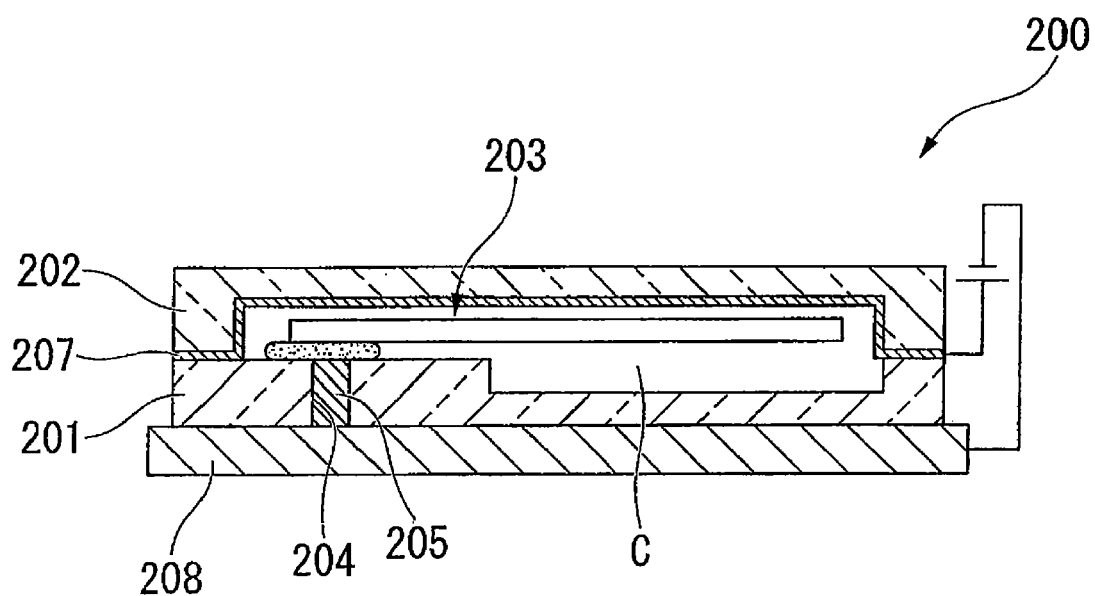
FIG. 23 is a view showing one step of the manufacturing process of the piezoelectric vibrator shown in FIG. 21.

As shown in FIG. 20, a radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the timepiece information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz is of a kind to propagate along the land surface and of a kind to propagate while reflecting between the ionospheric layer and the land surface, and therefore has a propagation range wide enough to cover all Japan through the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1. In the present embodiment, the piezoelectric vibrators 1 include quartz vibrator portions (piezoelectric vibrating reeds) 138 and 139 having resonance frequencies at 40 kHz and 60 kHz which are the same as the carrier frequency.

Furthermore, the filtered signal at the specific frequency is detected and demodulated by a detection and rectification circuit 134. Subsequently, the time code is extracted by a waveform shaping circuit 135 and counted by the CPU 136. The CPU 136 reads out information about the current year, the total number of days, the day of the week, and the time and the like. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given of the example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

According to the present embodiment, since the radio-controlled timepiece 130 includes the piezoelectric vibrator 1 which has high quality, it is possible to achieve high quality of the radio-controlled timepiece 130.

Although the embodiments of the present invention have been described in detail with reference to the drawings, the detailed configuration is not limited to the embodiments, and various changes can be made in design without departing from the spirit of the present invention.

For example, although the above-described embodiments have been described by way of an example of the grooved piezoelectric vibrating reed 4 in which the groove portions 18 are formed on both surfaces of the vibrating arms 10 and 11 as an example of the piezoelectric vibrating reed 4, the piezoelectric vibrating reed 4 may be a type of piezoelectric vibrating reed without the groove portions 18. However, since the field efficiency between the pair of the excitation electrodes 15 when a predetermined voltage is applied to the pair of excitation electrodes 15 can be increased by forming the groove portions 18, it is possible to suppress the vibration loss further and to improve the vibration properties much more. That is to say, it is to decrease the CI value (crystal impedance) further and to improve the performance of the piezoelectric vibrating reed 4 further. In this respect, it is preferable to form the groove portions 18.

In addition, although in the above-described embodiments, the base board 2 and the lid board 3 are formed with the recess portions 2a and 3a for cavities C, respectively, the present invention is not limited to this. For example, any one of the base board 2 and the lid board 3 may be formed with the recess portion for the cavity C.

In addition, the above-described embodiments have been described for the case where the manufacturing method of the package according to the present invention is applied to the manufacturing method of the piezoelectric vibrator for manufacturing the piezoelectric vibrator 1 in which the piezoelectric vibrating reed 4 is accommodated in the lead-out electrodes 36 and 37 in the cavity C of the package 9. However, the package manufacturing method can be applied to the case of manufacturing a structure in which a wiring different from the piezoelectric vibrating reed 4 is electrically connected to the lead-out electrodes 36 and 37.

Besides, within a range not deviating from the object of the present invention, constituent elements of the above-described embodiments may be appropriately substituted with well-known constituent elements, and the above-described modified examples may be appropriately combined.

What is claimed is:

1. A method for producing piezoelectric vibrators, comprising:
   (a) defining a plurality of first substrates on a first wafer and a plurality of second substrates on a second wafer;
   (b) forming a pair of penetration electrodes through respective at least some of the first substrates on the first wafer;
   (c) layering the first and second wafers such that at least some of the first substrates substantially coincide respectively with at least some of the corresponding second substrates, with a bonding film sandwiched between the first and second substrates in respective pairs of at least some of coinciding first and second substrates, wherein a piezoelectric vibrating strip is secured in respective pairs of at least some of coinciding first and second substrates;
   (d) placing on an electrode base portion the first wafer layered with the second wafer, wherein the electrode base portion has at least one area forming at least one gap for avoiding contact with the pair of penetration electrodes of respective at least some of the respective pairs of the first and second substrates;
   (e) applying a bonding voltage between the electrode base portion and at least some of the bonding films to anodically bond the first and second substrates of at least some of the respective pairs of the first and second substrates.

2. The method according to claim 1, wherein the at last one area is formed with at least one recess for forming the at least one gap between the electrode base portion and the first substrate.

3. The method according to claim 1, wherein the electrode base portion comprises a first layer on which the first wafer is placed and a second layer distal from the first wafer placed on the first layer, wherein the bonding voltage is applied to the second layer at a bonding temperature, and the first layer is made of a material in which inner ions are movable at the bonding temperature.

4. The method according to claim 3, wherein the first layer is made of a material having a thermal expansion coefficient substantially equal to that of the first wafer.

5. The method according to claim 3, wherein the first layer is made of a same material as the first wafer.

6. The method according to claim 3, wherein the second layer is made of stainless steel.

7. The method according to claim 3, wherein the first layer has a thickness substantially equal to that of the first substrate, and the at least one gap is substantially half as deep as the thickness of the first layer.

* * * * *